US005828248A

United States Patent [19]

Masuda

[11] Patent Number: 5,828,248

[45] Date of Patent: Oct. 27, 1998

[54] METHOD AND APPARATUS FOR GENERATING A CLOCK SIGNAL WHICH IS COMPENSATED FOR A CLOCK RATE THEREOF

[75] Inventor: Kazuaki Masuda, Kawasaki, Japan

[73] Assignee: NEC Corporation, Tokyo, Japan

[21] Appl. No.: 732,574

[22] Filed: Oct. 15, 1996

[30] Foreign Application Priority Data

Oct. 16, 1995 [JP] Japan .................................... 7-266939

[51] Int. Cl.[6] ........................................................ H03K 1/04

[52] U.S. Cl. .......................... 327/113; 327/117; 327/145; 327/151; 327/160; 327/292; 327/298; 377/20; 377/25; 377/47

[58] Field of Search ................................. 377/20, 25, 47; 327/113, 117, 145, 151, 160, 292, 298

[56] References Cited

U.S. PATENT DOCUMENTS 5,416,435 5/1995 Jokinen et al. ......................... 327/151

5,565,797 10/1996 Nakajima ................................ 327/162

*Primary Examiner*—Margaret Rose Wambach

*Attorney, Agent, or Firm*—Sughrue, Mion, Zinn, Macpeak & Seas, PLLC

[57] ABSTRACT

A deviation of a clock rate of the timepiece clock signal is determined relative to a reference clock rate of a reference clock signal (CR) which is either issued while the mobile unit is switched on or is contained in a received signal. The reference clock rate is higher than the clock rate of the timepiece clock signal. A count number (N) is calculated based on the deviation of the clock rate of the timepiece clock signal. The clock signal is generated such that the clock pulses the clock signal are successively issued each time the clock pulses of the timepiece clock signal counted up to the count number.

16 Claims, 3 Drawing Sheets

METHOD AND APPARATUS FOR GENERATING A CLOCK SIGNAL WHICH IS COMPENSATED FOR A CLOCK RATE THEREOF

BACKGROUND OF THE INVENTION

1. Field of the Invention

The present invention relates generally to improvements in a mobile communications unit which includes two clock generators of different accuracies, and more specifically to a method and apparatus for generating a clock signal by dividing a clock rate of a low precision timepiece clock signal after detecting a clock rate deviation of the timepiece clock signal relative to a high precision type reference clock signal.

2. Description of the Related Art

It is known in the art to provide two clock generators of different accuracies in a mobile communications unit. That is, one having a high precision high rate reference clock generator for controlling an overall operation of the mobile unit, and another having a low precision low rate clock generator for keeping a timepiece alive during the periods the mobile unit is switched off. The purpose of the independent provision of the timepiece clock generator is to minimize a battery power consumption during the periods the mobile unit is de-energized.

It is not unusual that the timepiece clock generator exhibits an accuracy lower than the reference clock generator to reduce manufacturing costs. Therefore, it is necessary to occasionally compensate for any clock rate deviation of the timepiece clock generator using the high precision reference clock pulses.

A known technique for the aforesaid clock rate compensation of the timepiece clock pulses is disclosed in the Japanese Laid-open Patent Application No. 4-60494.

This prior art discloses a reference clock generator and a timepiece clock generator. The reference frequency generator operates only while the mobile unit is energized. A frequency comparator is provided to determine, while the mobile unit is energized, a clock rate deviation between the two frequencies by comparing them. A variable frequency divider is supplied with the comparison result and compensates for the deviation of the clock pulses to be used for timing the timepiece. While the mobile unit is not energized, the timepiece frequency is directly applied to a timepiece control circuit without undergoing any clock rate compensation.

This prior art however, fails to suggest any explicit manner of how to ascertain the deviation of the timepiece frequency from the reference frequency. Further, the prior art fails to suggest any concrete arrangement for compensating the timepiece frequency by variably dividing the same. Still further, the prior art is unable to compensate for any deviation of the timepiece frequency while the mobile unit is not energized. Accordingly, with the above mentioned prior art, the timing errors undesirably accumulate while the mobile unit is switched off and become considerable when the mobile unit remains de-energized for long periods of time.

SUMMARY OF THE INVENTION

It is therefore an object of the present invention to provide a method of effectively compensating for a clock rate deviation of timepiece clock pulses from reference clock pulses.

Another object of the present invention is to provide an apparatus of accurately compensating for a clock rate deviation of timepiece clock pulses from reference clock pulses.

A first aspect of the present invention resides in a method of generating a clock signal by dividing a clock rate of a timepiece clock signal and compensating for a clock rate change of the timepiece clock signal in a mobile communications unit, the timepiece clock signal continuing to issue even if the mobile unit is switched off, the method comprising the steps of: (a) determining a deviation of a clock rate of the timepiece clock signal relative to a reference clock rate of a reference clock signal while the mobile unit is switched on, the reference clock rate being higher than the clock rate of the timepiece clock signal; (b) calculating a count number based on the deviation of the clock rate of the timepiece clock signal; and (c) generating the clock signal-whose clock pulses are successively issued each time the clock pulses of the timepiece clock signal are counted up to the count number.

A second aspect of the present invention resides in an apparatus for generating a clock signal by dividing a clock rate of a timepiece clock signal and compensating for a clock rate change of the timepiece clock signal in a mobile communication unit, the timepiece clock signal continuing to issue even if the mobile unit is switched off, the apparatus comprising means for determining a deviation of a clock rate of the timepiece clock signal relative to a reference clock rate of a reference clock signal while the mobile unit is switched on, the reference clock rate being higher than the clock rate of the timepiece clock signal; a calculator for calculating a count number based on the deviation of the clock rate of the timepiece clock signal; and a counter coupled to receive the timepiece clock signal and generating the clock signal whose clock pulses are successively issued each time the clock pulses of the timepiece are counted clock signal up to the count number.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

A first embodiment of the present invention will be described with reference to FIGS. 1 and 2.

Figure 1:
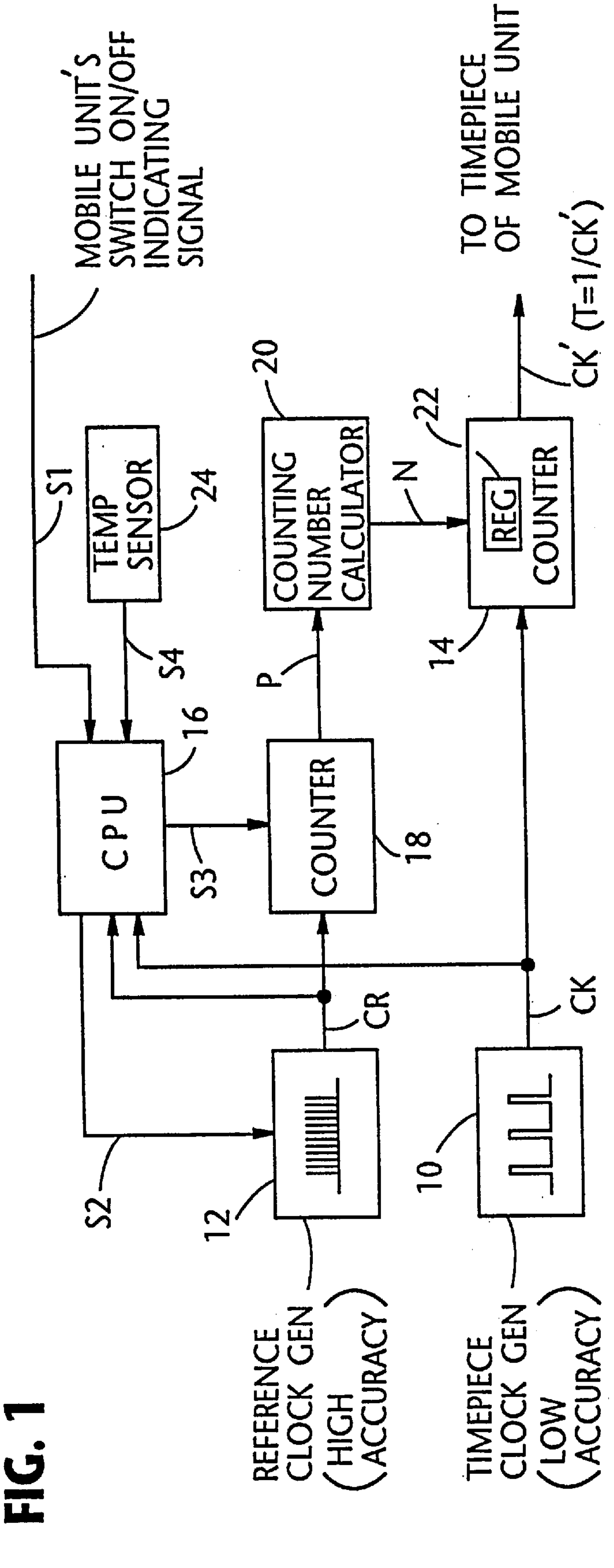
FIG. 1 is a block diagram schematically showing a first embodiment of the present invention.
Figure 2:
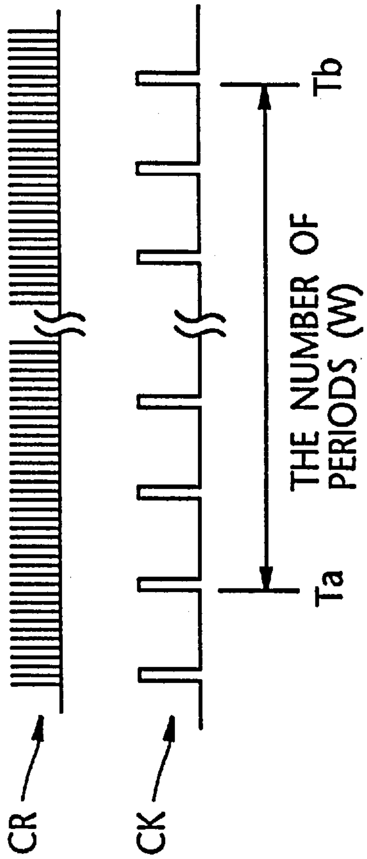
FIG. 2 is a diagram schematically showing two clock pulses appearing in the arrangement of FIG. 1.

As shown in FIG. 1, there are provided a timepiece clock generator 10 and a reference clock generator 12 in a mobile communications unit. The timepiece clock generator 10 continues to issue a series of low clock rate pulses CK to time a timepiece (not shown) even while the mobile unit is not energized. Although not shown in FIG. 1, the timepiece clock generator 10 is energized by a supplemental battery which can be recharged by a main power battery (not shown). On the other hand, the reference clock generator 12 issues a series of high clock rate pulses CR only while the mobile unit is energized (viz., a main power switch (not shown) is turned on). In order to facilitate a better understanding of the present invention, the clock rates of the signals CK and CR are respectively exemplified as 32 KHz and 19.2 MHz. Throughout the remaining of the instant disclosure, the clock pulses CK and CR are interchangeably depicted by clock signals CK and CR, respectively.

The clock pulses CR are used to control an overall operation of the mobile unit while the mobile unit is switched on and thus the clock signal CR is required to exhibit an accuracy much higher than that of the timepiece clock pulses CK.

As mentioned in the opening paragraphs, the timepiece clock generator 10 is of a low precision type to reduce manufacturing costs and thus, a deviation of the clock pulses CK from the reference clock pulses CR have to be occasionally corrected using the reference clock pulses CR.

The timepiece clock pulses CK are applied to a counter 14 and a CPU (central processing unit) 16. The counter 14 outputs a series of clock pulses CK' each of which is generated each time the counter 14 counts up to a given count number N. This number N is subject to change to correct the deviation of the clock pulses CK as will be discussed later in more detail. The period T of CK' is depicted by TB if the timepiece clock signal CK has no deviation from the clock signal CR. In other words, the period Ts implies the nominal period of the clock signal CK'. By way of example, Ts is set to 100 ms, When the CPU 16 receives a signal S1 indicating that the mobile unit is switched on, the CPU 16 issues a control signal S2 which initiates the operation of the reference clock generator 12. The clock pulses CR thus generated are applied to the CPU 14 and a counter 18.

When the CPU 16 senses that the clock pulse generator 12 reaches a stable state after the mobile unit is switched on, the CPU 16 issues a counter control signal S3 which is applied to the counter 18. More specifically, the CPU 16 responds to a leading edge (for example) of a given pulse of the signal CK (see a time point Ta in FIG. 2) and issues the counter control signal S3. The counter 18, in response to the control signal S3, counts the number of clock pulses CR until the CPU 16 issues the control signal S3 at a time point Tb (FIG. 2). It is to be noted that the signal S3 issued at Tb instructs the counter 18 to terminate the operation thereof. The number of periods (depicted by W) of the clock signal CK between the time points Ta and Tb is arbitrarily set but is determined in consideration of effectively implementing accurate counting of the clock pulses CR, facilitating circuit design, etc. The value of "W" is 100 merely by way of example.

Designating CRr and CKr the clock rates of the clock signals CR and Ck, respectively, the number of clock pulses CR (depicted by P) counted during the "W" periods (viz., between the time points Ta and Tb) is given by $$P=W[1/(CKr-D)]/[1/CRr]=W\cdot CRr/(CKr-D) \quad (1)$$

where "D" represents a deviation of the clock rate CKr.

The number of clock pulses CR thus determined is sent to a count number calculator 20 which calculates the count number N up to which the counter 14 counts the number of timepiece clock pulses CK.

The count number N is determined using the following equation.

$$N=Ts/W[1/(CRr-D)]=Ts(CKr-D)/W \quad (2)$$

The following relationship is obtained from equation (1).

$$(CKr-D)/W=CRr/P \quad (3)$$

Therefore, substituting (CKr−D)/W of equation (3) into equation (2), we obtain $$N=Ts\cdot CRr/P \quad (4)$$

The values of Ts and CRr are known, while the value of "P" is obtained at the calculator 20 and thus, N can be uniquely determined. Since N should be an integer, the computation result at the calculator 20 is rounded to the nearest whole number (viz., N is the rounded number).

The count number N, outputted from the calculator 20, is stored in a register 22 which may be included in the counter 14.

Thereafter, the counter 14 counts the clock pulses CK up to N in order to issue the timepiece control clock signal CK' whose period (depicted by T in FIG. 1) should equal Ts or a value in the vicinity of Ts. That is, $$T=N[1/(CKr-D)]=(N\cdot P)/(W\cdot CRr) \quad (5)$$

For a better understanding of the present invention, the operation for determining the count number N is described using particular values of CRr, CXr and Ts.

Assuming that CRr=19.2 MHz, CKr=32 KHz, Ts=100 ms, and W=100, the count number N is obtained using equation (4).

$$\begin{aligned} N &= (100\times10^{-3})\times(19.2\times(10^{6}/P) \\ &= 1920000/P \end{aligned} \quad (6)$$

If D=0, N is obtained from equation (2)

$$N=100\times10^{-3}\times32\times10^{3}/100=32 \quad (7)$$

From equations (6) and (7), if D=0 then P=60000. Therefore, several values of T around P=60000 are determined. From equation (5) we obtain $$T=(N\times P)/(100\times19.2\times10^{6}) \quad (8)$$

Therefore, equation (8) is rewritten as follows.

$$T=[(N\times P)/1920000]\times10^{-3} \quad (9)$$

For example,

If P=60200 then N=3189. Thus, T is about 99.99 ms.

If P=60300 then N=3184. Thus, T is about 100.00 ms.

If P=59000 then N=3254. Thus, T is about 99.99 ms.

It is understood from the foregoing that the period of the compensated timepiece clock signal CK' is, in fact, effectively compensated in a manner which causes it to be nearly equal to the nominal period 100 ms.

The count number N is stored in the register 22 and thus, the timepiece clock can be compensated even while the mobile unit is not energized. The count number N is updated each time the mobile unit is switched on. However, if the mobile unit remains energized for a long time duration, it is preferable to renew the count number N at predetermined time intervals (merely for example, every 24 hours).

A temperature sensor 24 may be provided to detect a temperature change of the mobile unit in that the low precision clock generator 10 is susceptible to excessively low or high ambient temperature. When the sensor 24 detects that the temperature of the mobile unit falls outside of a predetermined range, the sensor 24 supplies the CPU with a signal S4 indicative of an occurrence of an abnormal temperature change. The CPU 16 responds to the signal S4 and issues the signal S3 in order to renew the count number N.

When the mobile unit is switched off, the CPU is advised of the situation via the signal S1. In this cane, the CPU 16 terminates the operation of the reference clock generator 12.

Figure 3:
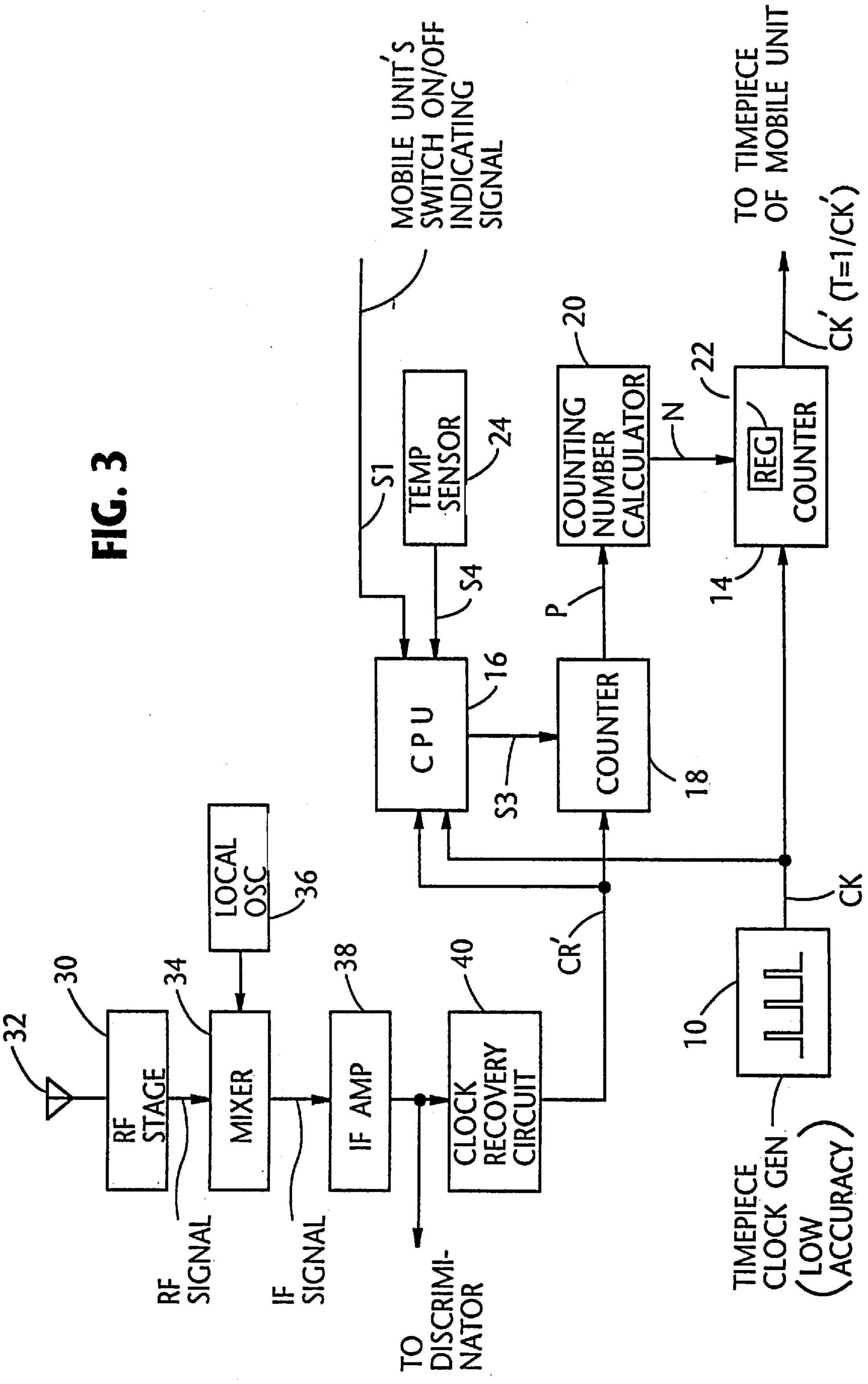
FIG. 3 is a block diagram schematically showing a second embodiment of the present invention.

Reference is made to FIG. 3, wherein a second embodiment of the present invention is schematically shown in block diagram form.

The second embodiment differs from the first one (shown in FIG. 1) in that the second embodiment uses a clock signal CR' recovered from a received signal in place of the reference clock pulses CR. The clock recovery is well known in the art and hence merely a brief description is given.

An RF (radio frequency) stage 30 is supplied with an RF signal via an antenna 32, amplifying the RF signal and applying it to a mixer 34. The mixer 34 converts the RF signal into an IF (intermediate frequency) signal using a local oscillator 36. Then, the IF signal is amplified at an amplifier 38. A clock recovery circuit 40 receives the amplified IF signal and extracts therefrom a clock signal accompanying the received signal. The clock recovery circuit 40 applies a recovered clock signal CR' to the CPU 16 and the counter 18. The subsequent operations are exactly the same as discussed above. If the base station of a mobile communications system is provided with a reference clock generator of a very highly accuracy, this technique will correctly implement the above mentioned timepiece clock compensation.

It will be understood that the above disclosure is representative of only two possible embodiments of the present invention and that the concept on which the invention is based is not specifically limited thereto.

What is claimed is:

1. A method of generating a clock signal by dividing a clock rate of a timepiece clock signal and by compensating for a change in the clock rate of said timepiece clock signal in a mobile unit, said timepiece clock signal being continuously generated even when the power of the mobile unit is switched off, said method comprising the steps of:

(a) determining a deviation of a clock rate of said timepiece clock signal relative to a reference clock rate of a reference clock signal when the power of the mobile unit is switched on, said reference clock rate being higher than the clock rate of said timepiece clock signal;

(b) calculating a count number based on the deviation of the clock rate of said timepiece clock signal; and (c) counting the clock pulses of said timepiece clock signal and generating said clock signal having clock pulses which are successively generated each time the clock pulses of said timepiece clock signal are counted up to said count number.

2. A method as claimed in claim 1, wherein said count number in stored in a storage means.

3. A method as claimed in claim 1, wherein said clock signal generated using said timepiece clock signal is used to operate a timepiece provided in the mobile unit.

4. A method as claimed in claim 2, wherein said deviation of the clock rate of said timepiece clock signal is determined by counting a number of clock pulses of said reference clock signal during a predetermined number of periods of said timepiece clock signal.

5. A method as claimed in claim 2, wherein said deviation of the clock rate of said timepiece clock signal is calculated when the power of the mobile unit is switched on.

6. A method as claimed in claim 2, wherein said deviation of the clock of said timepiece clock signal is calculated when a temperature of the mobile unit falls outside of a predetermined temperature range.

7. A method as claimed in claim 2, wherein said count number is updated at predetermined intervals while the mobile unit is energized for more than a predetermined length of time and wherein the updated count number is stored in said storage means in place of a previously stored count number.

8. A method as claimed in claim 2, wherein said reference clock signal is a clock signal recovered from a signal received by the mobile unit.

9. An apparatus for generating a clock signal by dividing a clock rate of a timepiece clock signal and by compensating for a change in the clock rate of said timepiece clock signal in a mobile unit, said timepiece clock signal being continuously generated even when power of the mobile unit is switched off, said apparatus comprising:

means for determining a deviation of a clock rate of said timepiece clock signal relative to a reference clock rate of a reference clock signal when the power of the mobile unit is switched on, said reference clock rate being higher than the clock rate of said timepiece clock signal;

a calculator for calculating a count number based on the deviation of the clock rate of said timepiece clock signal; and a counter for counting clock pulses of said timepiece clock signal and generating said clock signal having clock pulses which are successively generated each time the clock pulses of said timepiece clock signal are counted up to said count number.

10. An apparatus as claimed in claim 9, further comprising storage means for storing said count number.

11. An apparatus as claimed in claim 9, wherein said first clock signal is used to operate a timepiece provided in the mobile unit.

12. An apparatus as claimed in claim 10, wherein said deviation of the clock rate of said timepiece clock signal is determined by counting a number of clock pulses of said reference clock signal during a predetermined number of periods of said timepiece clock signal.

13. An apparatus as claimed in claim 10, wherein said deviation of the clock rate of said timepiece clock signal is calculated when the power of the mobile unit is switched on.

14. An apparatus as claimed in claim 10, wherein said deviation of the clock of said timepiece clock signal is calculated when a temperature of the mobile unit is outside of a predetermined temperature range.

15. An apparatus as claimed in claim 10, wherein said count number is updated at predetermined intervals when the power of the mobile unit is switched on for more than a predetermined period of time and wherein the updated count number is stored in said storage in place of a previously stored count number.

16. An apparatus as claimed in claim 10, wherein said reference clock signal is a clock signal recovered from a signal received by the mobile unit.

* * * * *

UNITED STATES PATENT AND TRADEMARK OFFICE

CERTIFICATE OF CORRECTION

PATENT NO. : 5,828,248
DATED : October 27, 1998
INVENTOR(S) : Kazuaki MASUDA

It is certified that error appears in the above-identified patent and that said Letters Patent is hereby corrected as shown below:

Column 3, line 24, delete "TB" and insert --Ts--.

Column 4, line 23, delete "CXr" and insert --CKr--.

Column 5, line 2, delete "cane" and insert --case--.

Signed and Sealed this

Fifteenth Day of June, 1999

Attest:

Q. TODD DICKINSON

*Attesting Officer* *Acting Commissioner of Patents and Trademarks*